United States Patent
Fujiwara et al.

(10) Patent No.: US 7,704,669 B2
(45) Date of Patent: Apr. 27, 2010

(54) ACRYLIC POLYMER AND RADIATION-SENSITIVE RESIN COMPOSITION

(75) Inventors: Kouichi Fujiwara, Tokyo (JP); Hiroshi Yamaguchi, Tokyo (JP); Atsushi Nakamura, Tokyo (JP)

(73) Assignee: JSR Corporation, Tokyo (JP)

( * ) Notice: Subject to any disclaimer, the term of this patent is extended or adjusted under 35 U.S.C. 154(b) by 508 days.

(21) Appl. No.: 10/567,117

(22) PCT Filed: Aug. 4, 2004

(86) PCT No.: PCT/JP2004/011143

§ 371 (c)(1),
(2), (4) Date: Jul. 31, 2007

(87) PCT Pub. No.: WO2005/012374

PCT Pub. Date: Feb. 10, 2005

(65) Prior Publication Data

US 2007/0269754 A1    Nov. 22, 2007

(30) Foreign Application Priority Data

Aug. 5, 2003    (JP) .............................. 2003-286389

(51) Int. Cl.
G03F 7/004 (2006.01)
C08F 220/18 (2006.01)
C08F 224/00 (2006.01)

(52) U.S. Cl. ................. 430/270.1; 430/907; 430/910; 526/245; 526/280; 526/281; 526/284

(58) Field of Classification Search ............ 430/270.1, 430/910, 907; 526/280, 281, 245, 284
See application file for complete search history.

(56) References Cited

U.S. PATENT DOCUMENTS

| | | | |
|---|---|---|---|
| 4,910,122 A | | 3/1990 | Arnold et al. |
| 7,179,578 B2 * | | 2/2007 | Sato et al. ................ 430/270.1 |
| 2001/0033990 A1 | | 10/2001 | Hatakeyama et al. |
| 2003/0091929 A1 * | | 5/2003 | Nishi et al. ............... 430/270.1 |
| 2004/0176630 A1 * | | 9/2004 | Watanabe et al. ........... 558/430 |
| 2004/0202954 A1 * | | 10/2004 | Momota et al. ............. 430/170 |

FOREIGN PATENT DOCUMENTS

JP    59-93448    5/1984

(Continued)

OTHER PUBLICATIONS

International Search Report dated Nov. 16, 2004.
Database WPI Week 200408; Derwent Publications Ltd., London, GB; AN 2004-075181 (XP002418903) (Abstract).
Database WPI Week 200329; Derwent Publications Ltd., London, GB; AN 2003-294030 (XP002418904) (Abstract).

Primary Examiner—John S Chu
(74) Attorney, Agent, or Firm—Ditthavong Mori & Steiner, P.C.

(57) ABSTRACT

To provide a resist which is excellent in the solubility in a resist solvent and little dependent on baking temperature and can form developed patterns reduced in line edge roughness. An acrylic polymer characterized by comprising units of the general formula (1), units of general formula (2), and units of general formula (3) and/or units of general formula (4), wherein R, R', R'' and R''' are each hydrogen, methyl, or trifluoromethyl; $R^1$ is hydrogen, $C_{1-4}$ linear or branched alkyl, alkoxy, or $C_{1-4}$ linear or branched fluoroalkyl; X is a $C_{7-20}$ polycyclic aliphatic hydrocarbon group consisting of carbon atoms and hydrogen atoms; $R^2$ and $R^3$ are each independently $C_{1-4}$ linear or branched alkyl; $R^4$ is a $C_{4-20}$ alicyclic hydrocarbon group; $R^5$ is $C_{1-4}$ linear or branched alkyl; and $R^6$ and $R^7$ are each hydrogen or $C_{1-4}$ linear or branched alkyl.

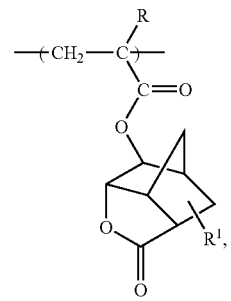

(1)

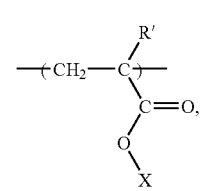

(2)

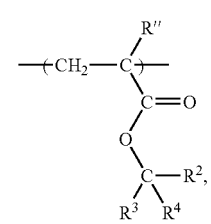

(3)

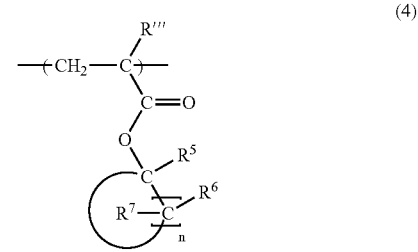

(4)

7 Claims, No Drawings

FOREIGN PATENT DOCUMENTS

| | | |
|---|---|---|
| JP | 05-188598 | 7/1993 |
| JP | 06-12452 | 2/1994 |
| JP | 06-313968 | 11/1994 |
| JP | 09-120163 | 5/1997 |
| JP | 2001-337448 | 12/2001 |
| JP | 2002-145934 | 5/2002 |
| JP | 2002-145955 | 5/2002 |
| JP | 2002-201232 | 7/2002 |
| JP | 2003043690 | 2/2003 |
| JP | 2003-084436 | 3/2003 |
| JP | 2003-195507 | 7/2003 |
| JP | 2003206315 | 7/2003 |

\* cited by examiner

ACRYLIC POLYMER AND RADIATION-SENSITIVE RESIN COMPOSITION

This application is a U.S. National Stage application filed under 35 U.S.C. §371, based on International Application No. PCT/JP2004/011143, filed Aug. 4, 2004, which is incorporated herein by reference in its entirety.

TECHNICAL FIELD

The present invention relates to an acrylic polymer and a radiation-sensitive resin composition and, particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams, as well as to an acrylic polymer utilized in the composition.

BACKGROUND ART

In the field of microfabrication represented by the manufacture of integrated circuit elements, lithographic technology enabling microfabrication with a line width of about 200 nm or less using an ArF excimer laser (wavelength: 193 nm), $F_2$ excimer laser (wavelength: 157 nm), and the like has been demanded in order to achieve higher integration in recent years. As a radiation-sensitive resin composition applicable to the excimer laser radiation, a number of chemically-amplified radiation-sensitive compositions utilizing a chemical amplification effect of a component having an acid-labile functional group and an acid generator which is a component generating an acid upon irradiation have been proposed. For example, a polymer for photoresist comprising a resin component with a specific structure which contains a monomer unit having a norbornane ring derivative as a resin component is known (Japanese Patent Applications Laid-open No. 2002-201232 and No. 2002-145955).

A resist composition using a (meth)acrylic acid copolymer with narrow molecular weight distribution which contains an ester of a (meth)acrylic acid with a specific monocyclohexane, bicycloheptane carbolactone, or the like as a recurring unit is also known (Japanese Patent Application Laid-open No. 2003-84436).

However, to achieve a higher degree of integration in the field of semiconductor, a radiation-sensitive resin composition used as a resist is required to possess more excellent resolution. In addition, along with the progress of microfabrication there are a number of cases in which a minor defect during development results in a fatal defect in the design of devices. As a countermeasure against this problem, in addition to the effort for increasing a process margin such as increasing resolution as a resist and radiation dose-dependency, promoting solubility of the resist in a solvent is regarded as an urgent subject of development, since minute defects produced during development are supposed to originate from the resin which is a component forming the resist. Acrylic resins commonly used at the present time, possessing bulky side chains grafted on a rigid main chain are deemed to exhibits very low solubility in solvents commonly used for resists. Moreover, a good margin against variation of process conditions, in particularly, a minimal line width change due to the change in baking temperature is demanded along with progress of miniaturization.

DISCLOSURE OF THE INVENTION

An object of the present invention is to provide a radiation-sensitive resin composition having high transparency to radiation, excelling in basic properties as a resist such as sensitivity, resolution, dry etching resistance, and pattern shape, and, in particular, excelling in solubility in a resist solvent, exhibiting minimal dependency on baking temperature, and reducing line edge roughness of patterns after development, by utilizing an acrylic polymer having a specific structure, and the acrylic polymer used in the radiation-sensitive resin composition.

The acrylic polymer of the present invention is characterized by comprising a recurring unit (i) represented by the following formula (1), a recurring unit (ii) represented by the following formula (2), and an acid-labile group-containing recurring unit (iii) which contains at least one unit selected from a recurring unit represented by following formula (3) and formula (4),

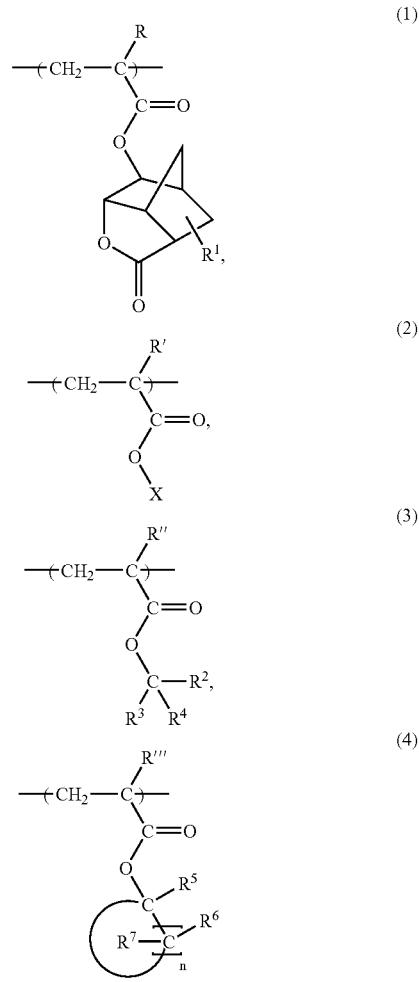

wherein R, R', R", and R'" individually represent a hydrogen atom, methyl group, or trifluoromethyl group, $R^1$ represents a hydrogen atom, linear or branched alkyl group having 1-4 carbon atoms, linear or branched alkoxyl group having 1-4 carbon atoms, or linear or branched fluoroalkyl group having 1-4 carbon atoms, X represents a polyalicyclic hydrocarbon group consisting only of carbon and hydrogen and having 7-20 carbon atoms, $R^2$ and $R^3$ individually represent a linear or branched alkyl group having 1-4 carbon atoms, $R^4$ represents an alicyclic hydrocarbon group having 4-20 carbon atoms, $R^5$ represents a linear or branched alkyl group having 1-4 carbon atoms, $R^6$ and $R^7$ individually represent a hydrogen atom or a linear or branched alkyl group having 1-4 carbon atoms, and n indicates an integer from 3 to 7.

The recurring unit (iii) is preferably a group of the above formula (4), and particularly a group of the formula (4) in which $R^5$ is a methyl group or ethyl group, $R^6$ and $R^7$ are hydrogen atoms, and n is 4 or 5.

The radiation-sensitive resin composition of the present invention comprises the above acrylic polymer as a resin component and further comprises a photoacid generator.

Because the acrylic polymer of the present invention comprises the recurring unit (i) of the formula (1), the recurring unit (ii) of the formula (2), which has a polyalicyclic hydrocarbon group not containing a polar group and consisting only of carbon and hydrogen on the side chain, and an acid-labile group-containing recurring unit (iii) represented by the formula (3) and/or formula (4), the acrylic polymer possesses basic properties as a chemically amplified resist sensitive to active radiation, particularly to deep ultraviolet rays represented by an ArF excimer laser (wavelength: 193 nm), such as high transparency to radiation, high sensitivity, superior resolution, dry etching tolerance, and good pattern profile. In addition, the acrylic polymer can reduce not only pattern line edge roughness after resolution, but also dependency on post exposure bake (hereinafter called "PEB").

BEST MODE FOR CARRYING OUT THE PRESENT INVENTION

The present invention will now be described in more detail by way of embodiments.

The recurring unit (i) represented by the formula (1) has an alicyclic hydrocarbon group originating from 5-oxo-4-oxatricyclo[4.2.1.0$^{3,7}$]nonane as a lactone skeleton in part of the side chains. The lactone skeleton may be substituted with a linear or branched alkyl group, alkoxyl group, or fluoroalkyl group having 1-4 carbon atoms.

As examples of the linear or branched alkyl group having 1-4 carbon atoms, a methyl group, ethyl group, n-propyl group, i-propyl group, n-butyl group, 2-methylpropyl group, 1-methylpropyl group, and t-butyl group can be given. As examples of the linear or branched alkoxyl groups having 1-4 carbon atoms, a methoxyl group, ethoxyl group, n-propoxyl group, i-propoxyl group, n-butoxyl group, 2-methylpropoxyl group, 1-methylpropoxyl group, and t-butoxyl group can be given. As the linear or branched fluoroalkyl group having 1-4 carbon atoms, groups in which part or all of the hydrogen atoms in the above alkyl group are replaced with fluorine atoms can be given.

Preferable groups among the recurring unit (i) represented by the formula (1) has an alicyclic hydrocarbon group originating from 5-oxo-4-oxatricyclo[4.2.1.0$^{3,7}$]nonane on the side chains.

The recurring unit (ii) represented by the formula (2) has a polyalicyclic hydrocarbon group having 7-20 carbon atoms and consisting only of carbon atoms and hydrogen atoms in part of the side chains as the group X. Preferably, the recurring unit (ii) has a polyalicyclic hydrocarbon group having 7-20 carbon atoms, consisting only of carbon atoms and hydrogen atoms, and not containing a polar group in part of the side chains. As examples of such an polyalicyclic hydrocarbon group, alicyclic hydrocarbon groups originating from cycloalkanes such as bicyclo[2.2.1]heptane (2a), bicyclo[2.2.2]octane (2b), tricyclo[5.2.1.0$^{2,6}$]decane (2c), tetracyclo[6.2.1.1$^{3,6}$.0$^{2,7}$]dodecane (2d), and tricyclo[3.3.1.1$^{3,7}$]decane shown by the following formulas can be given.

(2a)

(2b)

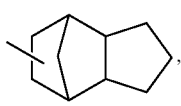

(2c)

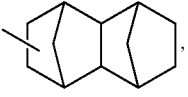

(2d)

(2e)

These alicyclic rings originating from cycloalkanes may be substituted with one or more groups. For example, skeletons substituted with one or more linear, branched, or cyclic alkyl groups having 1-4 carbon atoms such as a methyl group, ethyl group, n-propyl group, i-propyl group, n-butyl group, 2-methylpropyl group, 1-methylpropyl group, or t-butyl group can be given. Specific examples include, but are not limited to, the following groups. These groups may be used either individually or in combination of two or more.

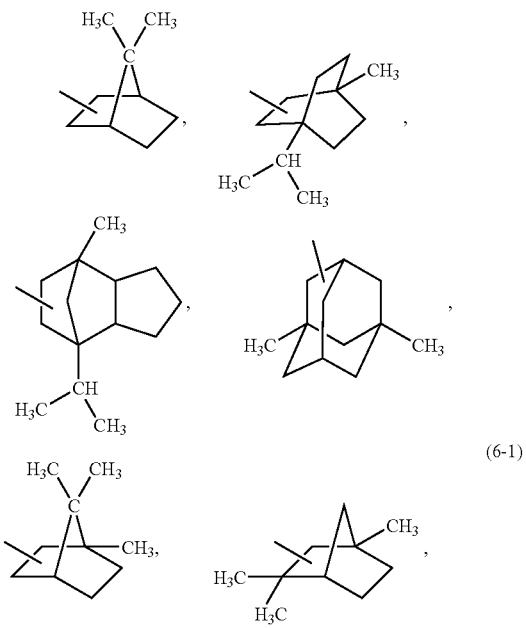

(6-1)

-continued

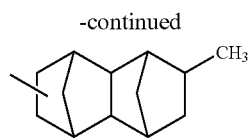

The recurring unit (iii) represented by the formula (3) and/or (4) is a unit containing an acid-labile group.

As examples of $R^2$ and $R^3$, a methyl group, ethyl group, n-propyl group, i-propyl group, n-butyl group, 2-methylpropyl group, 1-methylpropyl group, and t-butyl group can be given.

As examples of $R^4$, hydrocarbon groups originating from cyclobutane, cyclopentane, cyclohexane, cycloheptane, cyclooctane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, tricyclo[3.3.1.1$^{3,7}$]decane, or derivatives of these compounds can be given.

As examples of $R^5$, a methyl group, ethyl group, n-propyl group, i-propyl group, n-butyl group, 2-methylpropyl group, 1-methylpropyl group, and t-butyl group can be given.

As examples of $R^6$, a hydrogen atom, methyl group, ethyl group, n-propyl group, i-propyl group, n-butyl group, 2-methylpropyl group, 1-methylpropyl group, and t-butyl group can be given.

In the recurring unit (iii), the acid-labile group preferably has an alicyclic ring.

A preferable recurring unit (iii) is a recurring unit of the formula (4). Examples of particularly preferable recurring unit (iii) include the groups of the following formulas (4-1) to (4-4), (4-1)
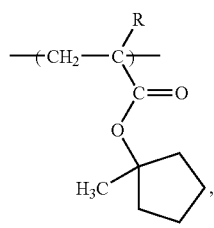

(4-2)
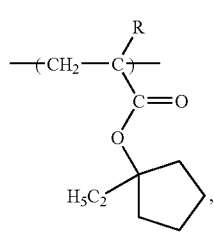

(4-3)
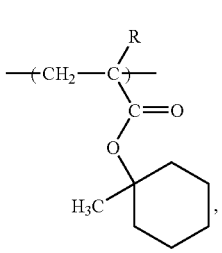

-continued (4-4)
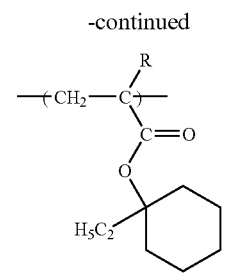

wherein R represents a hydrogen atom, methyl group, or trifluoromethyl group.

Among the groups of the formulas (4-1) to (4-4), the groups of the formula (4-1) and formula (4-2) are preferable in view of the combination of recurring units in the present invention.

The acrylic polymer of the present invention is preferably formed from the above-described recurring units (i), (ii), and acid-labile group-containing units containing (iii). As examples of the monomers producing the recurring units represented by the formulas (i), (ii), or (iii), esters of acrylic acid derivatives shown by the formulas (1-1), (2-1), (3-1), or (4-5) can be given, (1-1)
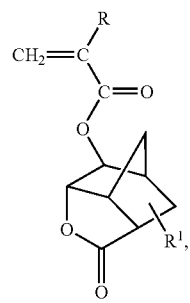

(2-1)
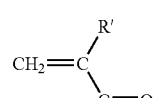

(3-1)
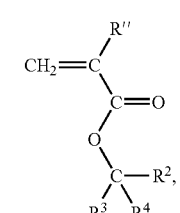

(4-5)
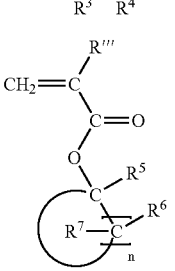

wherein R, R', R", R'", $R^1$ to $R^6$, X, and n are the same as defined in the formulas (1), (2), (3), and (4).

In the acrylic polymer of the present invention, the following monomers can be given as the monomer forming the acid-labile group-containing recurring units with the recurring unit (iii). In the following description, (meth)acryl means acryl or methacryl. Specifically, acid-labile group-containing monomers such as 2-methyladamantan-2-yl(meth)acrylate, 2-ethyladamantan-2-yl(meth)acrylate, 2-n-propyladamantan-2-yl(meth)acrylate, 2-isopropyladamantan-2-yl(meth)acrylate, 1-(adamantan-1-yl)-1-methylethyl(meth)acrylate, 2-methylbicyclo[2.2.1]hept-2-yl(meth)acrylate, 2-ethylbicyclo[2.2.1]hept-2-yl(meth)acrylate, 8-methyltricyclo[$5.2.1.0^{2,6}$]dec-8-yl(meth)acrylate, 8-ethyltricyclo[$5.2.1.0^{2,6}$]dec-8-yl(meth)acrylate, 4-methyltetracyclo[$6.2.1.1^{3,6}.0^{2,7}$]dodec-4-yl(meth)acrylate, 4-ethyltetracyclo[$6.2.1.1^{3,6}.0^{2,7}$]dodec-4-yl(meth)acrylate, 1-(tetracyclo[$6.2.1.1^{3,6}.0^{2,7}$]dodec-4-yl)-1-methylethyl(meth)acrylate, 1,1-dicyclohexylethyl(meth)acrylate, and the like can be given.

The acrylic polymer of the present invention preferably is constituted by the recurring unit (i), recurring unit (ii), and an acid-labile group-containing unit which contains the recurring unit (iii), and particularly preferably by the recurring unit (i), recurring unit (ii), and recurring unit (iii).

The proportion of these recurring units in the total recurring units from which the acrylic polymer is formed is 20-70 mol % of the recurring unit (i), 1-20 mol % of the recurring unit (ii), and 20-60 mol % of the acid-labile group-containing recurring unit (iii), with preferable range being respectively 30-60 mol %, 3-15 mol %, and 30-50 mol %.

If the content of the recurring unit (i) is less than 20 mol %, the resist tends to exhibit poor developability; if more than 70 mol %, resolution of the resist and solubility in a resist solvent tend to decrease. If the amount of the recurring unit (ii) is less than 1 mol %, resolution tends to decrease; if more than 20 mol %, resolution tends to decrease. If the amount of the acid-labile group-containing recurring unit (iii) is less than 20 mol %, resolution tends to decrease; if more than 60 mol %, developability tends to decrease.

In the acid-labile group-containing recurring unit (iii), the amount of the recurring unit (iii) is preferably 10 mol % or more of the total amount of the recurring units forming the acrylic polymer.

The acrylic polymer of the present invention can be prepared by, for example, polymerizing a mixture of monomers corresponding to each of the above recurring units in an appropriate solvent in the presence of a chain transfer agent, as required, using a radical polymerization initiator such as hydroperoxide, dialkyl peroxide, diacyl peroxide, or azo compound.

As examples of the solvent which can be used for the polymerization, cycloalkanes such as cyclohexane, cycloheptane, cyclooctane, decalin, norbornane; saturated carboxylic acid esters such as ethyl acetate, n-butyl acetate, i-butyl acetate, methyl propionate, and propylene glycol monomethyl ether acetate; alkyllactones such as γ-butyrolactone; alkylketones such as 2-butanone, 2-heptanone, and methyl isobutyl ketone; cycloalkylketones such as cyclohexanone; alcohols such as 2-propanol and propylene glycol monomethyl ether; and the like can be given.

These solvents may be used either individually or in combinations of two or more.

The polymerization temperature is usually from 40 to 120° C., and preferably from 50 to 100° C. The reaction time is usually from 1 to 48 hours, and preferably from 1 to 24 hours.

The acrylic polymer of the present invention has a small content of impurities such as halogen and metals and preferably contains residual monomers and oligomer components in a specific amount or less, for example, 0.1 wt % or less when measured by HPLC. This not only further improves sensitivity, resolution, process stability, pattern profile, and the like as a resist, but also enables provision of a radiation-sensitive resin composition usable as a resist having no foreign particle in the solution and showing no change in sensitivity over time.

As examples of the purification method for the acrylic polymer, the following methods can be given. As a method for removing impurities such as metals, a method of adsorbing metals in the resin solution using a zeta-potential filter, a method of transforming the metals into a chelate state by washing the resin solution with an acidic aqueous solution such as oxalic acid or sulfonic acid and removing the metals, and the like can be given. As a method for removing the residual monomers and oligomer components at a specific value or less, a liquid-liquid extraction method in which the residual monomers and oligomer components are removed by combining washing with water and a suitable solvent, a purification method in a solution state such as ultrafiltration in which only the components having a specific molecular weight or less are extracted and removed, a reprecipitation method in which the residual monomers and the like are removed by adding the acrylic polymer solution to a poor solvent dropwise, thereby causing the polymer solution to coagulate in the poor solvent, a purification method in a solid state in which the polymer slurry separated by filtration is washed with a poor solvent, and the like can be given. These methods may be used in combination. The type of the poor solvent used in the reprecipitation method varies depending on the properties of the acrylic polymer to be purified and the like. Such a poor solvent is therefore appropriately selected.

The polystyrene-reduced weight average molecular weight (hereinafter referred to as "Mw") of the acrylic polymer determined by gel permeation chromatography (GPC) is usually from 1,000 to 300,000, preferably from 2,000 to 200,000, and still more preferably from 3,000 to 100,000. If the Mw of the acrylic polymer is less than 1,000, heat resistance as a resist may be decreased. If the Mw exceeds 300,000, developability as a resist may be decreased.

The ratio of Mw to the polystyrene-reduced number average molecular weight (hereinafter referred to as "Mn") determined by gel permeation chromatography (GPC) (Mw/Mn) of the acrylic polymer is usually from 1 to 5, and preferably from 1 to 3.

Mw and Mn were measured by gel permeation chromatography (GPC) using GPC columns ($G2000H_{XL} \times 2$, $G3000H_{XL} \times 1$, and $G4000H_{XL} \times 1$, manufactured by Tosoh Corp.) in a high performance GPC apparatus ("HLC-8120" manufactured by Tosoh Corp.) under the following conditions. Flow rate: 1.0 ml/minute, eluate: tetrahydrofuran, column temperature: 40° C., standard reference material: monodispersed polystyrene In the present invention, the acrylic polymer can be used either individually or in combination of two or more.

The acrylic polymer is usually insoluble or scarcely soluble in alkali, but becomes easily soluble in alkali by the action of an acid. Therefore, the polymer can be suitably used as an acid-labile group-containing resin in a radiation-sensitive resin composition.

A radiation-sensitive resin composition can be obtained by combining the acrylic polymer as an acid-labile group-containing resin and an acid generator which generates an acid by being irradiated with radiation.

As the acid generator, onium salt compounds such as sulfonium salt and iodonium salt, organo halide compounds, sulfone compounds such as disulfones and diazomethane sulfones, and the like can be given.

As preferable examples of the acid generator, triphenylsulfonium salt compounds such as triphenylsulfonium trifluoromethanesulfonate, triphenylsulfonium-nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium-2-(3-tetracyclo[4.4.0.1$^{2,5}$.1$^{7,10}$]dodecanyl)-1,1-difluoroethanesulfonate, triphenylsulfonium N,N'-bis(nonafluoro-n-butanesulfonyl)imidate, and triphenylsulfonium camphorsulfonate; 4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium-2-bicyclo[2.2.1]hept-2-yl-1,1,2,2-tetrafluoroethanesulfonate, 4-cyclohexylphenyldiphenylsulfonium-2-(3-tetracyclo[4.4.0.1$^{2,5}$.1$^{7,10}$]dodecanyl)-1,1-difluoroethanesulfonate, 4-cyclohexylphenyldiphenylsulfonium N,N'-bis(nonafluoro-n-butanesulfonyl)imidate, and 4-cyclohexylphenyldiphenylsulfonium camphorsulfonate; 4-t-butylphenyldiphenylsulfonium salt compounds such as 4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium-2-bicyclo[2.2.1]hept-2-yl-1,1,2,2-tetrafluoroethanesulfonate, 4-t-butylphenyldiphenylsulfonium-2-(3-tetracyclo[4.4.0.1$^{2,5}$.1$^{7,10}$]dodecanyl)-1,1-difluoroethanesulfonate, 4-t-butylphenyldiphenylsulfonium N,N'-bis(nonafluoro-n-butanesulfonyl)imidate, and 4-t-butylphenyldiphenylsulfonium camphorsulfonate; tri(4-t-butylphenyl)sulfonium salt compounds such as tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium-2-bicyclo[2.2.1]hept-2-yl-1,1,2,2-tetrafluoroethanesulfonate, tri(4-t-butylphenyl)sulfonium-2-(3-tetracyclo[4.4.0.1$^{2,5}$.1$^{7,10}$]dodecanyl)-1,1-difluoroethanesulfonate, tri(4-t-butylphenyl)sulfonium N,N'-bis(nonafluoro-n-butanesulfonyl)imidate, and tri(4-t-butylphenyl)sulfonium camphorsulfonate; diphenyliodonium salt compounds such as diphenyliodonium trifluoromethanesulfonate, diphenyliodonium-nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium-2-(3-tetracyclo[4.4.0.1$^{2,5}$.1$^{7,10}$]dodecanyl)-1,1-difluoroethanesulfonate, diphenyliodonium N,N'-bis(nonafluoro-n-butanesulfonyl)imidate, and diphenyliodonium camphorsulfonate; bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium-2-bicyclo[2.2.1]hept-2-yl-1,1,2,2-tetrafluoroethanesulfonate, bis(4-t-butylphenyl)iodonium-2-(3-tetracyclo[4.4.0.1$^{2,5}$.1$^{7,10}$]dodecanyl)-1,1-difluoroethanesulfonate, bis(4-t-butylphenyl)iodonium N,N'-bis(nonafluoro-n-butanesulfonyl)imidate, and bis(4-t-butylphenyl)iodonium camphorsulfonate; 1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium-2-bicyclo[2.2.1]hept-2-yl-1,1,2,2-tetrafluoroethanesulfonate, 1-(4-n-butoxynaphthalen-1-yl)tetrahydrothiophenium-2-(3-tetracyclo[4.4.0.1$^{2,5}$.1$^{7,10}$]dodecanyl)-1,1-difluoroethanesulfonate, 1-(4-n-butoxynaphthalen-1-yl)tetrahydrothiophenium-N,N'-bis(nonafluoro-n-butanesulfonyl)imidate, and 1-(4-n-butoxynaphthalen-1-yl)tetrahydrothiophenium camphorsulfonate; 1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium-2-bicyclo[2.2.1]hept-2-yl-1,1,2,2-tetrafluoroethanesulfonate, 1-(3,5-dimethyl-4-hydroxyphenyl)tetrahydrothiophenium-2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium-N,N'-bis(nonafluoro-n-butanesulfonyl)imidate, and 1-(3,5-dimethyl-4-hydroxyphenyl)tetrahydrothiophenium camphorsulfonate; succinimide compounds such as N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide, and N-(camphorsulfonyloxy)succinimide; bicyclo[2.2.1]hept-5-ene-2,3-dicarboxyimides such as N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]-hept-5-ene-2,3-dicarboxyimide, N-(2-(3-tetracyclo[4.4.0.1$^{2,5}$.1$^{7,10}$]dodecanyl)-1,1-difluoroethanesulfonyloxy)-bicyclo[2.2.1]hept-5-ene-2,3-dicarboxyimide, N-(camphorsulfonyloxy)bicyclo[2.2.1]hept-5-ene-2,3-dicarboxyimide, and the like can be given.

In the present invention, the acid generators can be used either individually or in combination of two or more. In order to ensure sensitivity and developability as a resist, the amount of acid generator to be used is usually from 0.1 to 30 parts by weight, and preferably from 0.1 to 20 parts by weight for 100 parts by weight of the acrylic polymer. If the amount of the acid generator is less than 0.1 part by weight, sensitivity and developability may be decreased. If the amount exceeds 30 parts by weight, a rectangular resist pattern may not be obtained due to decreased transparency to radiation.

Various types of additives such as acid diffusion controllers, alicyclic additives having an acid-labile group, alicyclic additives having no acid-labile group, surfactants, and sensitizers may optionally be added to the radiation-sensitive resin composition of the present invention.

The acid diffusion controllers control diffusion of an acid generated from the acid generator upon irradiation in the resist film to suppress undesired chemical reactions in the non-irradiated area.

Addition of the acid diffusion controller further improves storage stability of the resulting radiation-sensitive resin composition and resolution of the resist. Moreover, the addition of the acid diffusion controller prevents the line width of the resist pattern from changing due to changes in the post-exposure delay (PED) between irradiation and development, whereby a composition with remarkably superior process stability can be obtained.

As the acid diffusion controller, nitrogen-containing organic compounds of which the basicity does not change during irradiation or heating when forming a resist pattern are preferable.

As examples of the nitrogen-containing organic compound, tertiary amine compounds, amide group-containing compounds, quaternary ammonium hydroxide compounds, and nitrogen-containing heterocyclic compounds can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonyl amine, tri-n-decylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, 2,6-diisopropylaniline, diphenylamine, triphenylamine, and naphthylamine; alkanolamines such as triethanolamine and diethanolaniline; N,N,N',N'-tetramethylethylenediamine, N,N,N',N'-tetrakis(2-hydroxypropyl) ethylenediamine, 1,3-bis[1-(4-aminophenyl)-1-methylethyl] benzenetetramethylenediamine, 2,2-bis(4-aminophenyl) propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl)ether, and the like.

As examples of the amide group-containing compounds, in addition to N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, N-t-butoxycarbonyl-pyrrolidine, N-t-butoxycarbonyl-piperidine, N-t-butoxycarbonyl-4-hydroxypiperidine, and N-t-butoxycarbonylmorpholine, formamide, N-methylformamide, N,N-dimethylformamide, acetamide, N-methylacetamide, N,N-dimethylacetamide, propionamide, benzamide, pyrrolidone, N-methylpyrrolidone, and the like can be given.

As examples of the quaternary ammonium hydroxide compound, tetramethylammonium hydroxide, tetraethylammonium hydroxide, tetra-n-propylammonium hydroxide, and tetra-n-butylammonium hydroxide can be given.

Examples of the nitrogen-containing heterocyclic compounds include: imidazoles such as imidazole, 4-methylimidazole, 1-benzyl-2-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; and pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing heterocyclic compounds, the tertiary amine compounds, amide group-containing compounds, and nitrogen-containing heterocyclic compounds are preferable. Among the amide group-containing compounds, N-t-butoxycarbonyl group-containing amino compounds are preferable. Among the nitrogen-containing heterocyclic compounds, imidazoles are preferable.

The acid diffusion controller may be used either individually or in combination of two or more. The amount of the acid diffusion controller to be added is usually 15 parts by weight or less, preferably 10 parts by weight or less, and still more preferably 5 parts by weight or less for 100 parts by weight of the acrylic polymer. If the amount of the acid diffusion controller exceeds 15 parts by weight, sensitivity as a resist and developability of the irradiated area tend to decrease. If the amount is less than 0.001 part by weight, the pattern profile or dimensional accuracy as a resist may decrease depending on the processing conditions.

The alicyclic additives having an acid-labile group and alicyclic additives having no acid-labile group improve dry etching resistance, pattern profile, adhesion to the substrate, and the like.

As examples of such alicyclic additives, adamantane derivatives such as t-butyl 1-adamantanecarboxylate, t-butoxycarbonylmethyl 1-adamantanecarboxylate, γ-butyrolactone 1-adamantanecarboxylate, di-t-butyl 1,3-adamantanedicarboxylate, t-butyl 1-adamantaneacetate, t-butoxycarbonylmethyl 1-adamantanacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; and the like can be given.

These alicyclic additives may be used either individually or in combination of two or more. The amount of the alicyclic additives to be added is usually 50 parts by weight or less, and preferably 30 parts by weight or less for 100 parts by weight of the acrylic polymer. If the amount of the alicyclic additives exceeds 50 parts by weight, heat resistance as a resist tends to decrease.

The surfactants as an additive improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products-Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more. The amount of surfactants to be added is usually two parts by weight or less for 100 parts by weight of the acrylic polymer.

The sensitizers as an additive absorb radiation energy and transmit the energy to the acid generator, thereby increasing the amount of an acid generated upon exposure. The sensitizers improve apparent sensitivity of the radiation-sensitive resin composition.

As examples of sensitizers, carbazoles, benzophenones, rose bengals, anthracenes, and phenols can be given.

These sensitizers may be used either individually or in combinations of two or more. The amount of sensitizers to be added is preferably 50 parts by weight or less for 100 parts by weight of the acrylic polymer.

As examples of other additives, halation inhibitors, adhesion promoters, storage stabilizers, anti-foaming agents, and the like can be given.

When using, the radiation-sensitive resin composition of the present invention is usually made into a composition solution by dissolving the composition in a solvent so that the total solid content is usually from 3 to 50 wt %, and preferably from 5 to 25 wt %, and filtering the solution using a filter with a pore diameter of about 0.2 μm, for example.

As examples of solvents used for preparation of the composition solution, in addition to linear or branched ketones such as 2-pentanone, 2-hexanone, 2-heptanone, and 2-octanone; cyclic ketones such as cyclopentanone and cyclohexanone; propylene glycol monoalkyl ether acetates such as propylene glycol monomethyl ether acetate and propylene glycol monoethyl ether acetate; alkyl 2-hydroxypropionate such as methyl 2-hydroxypropionate and ethyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methyl pyrrolidone, γ-butyrolactone, and the like can be given.

Although these solvents may be used either individually or in combination of two or more, inclusion of at least one of the solvents selected from propylene glycol monomethyl ether acetate, propylene glycol monomethyl ether, 2-heptanone, cyclohexanone, γ-butyrolactone, ethyl 2-hydroxypropionate, and ethyl 3-ethoxypropionate is preferable. Cyclohexanone is an effective solvent from the viewpoint of solubility, but its use should be avoided because of toxicity.

The radiation-sensitive resin composition of the present invention is particularly useful as a chemically-amplified resist. The composition is particularly useful as a positive-tone resist that can reduce line edge roughness of patterns after development.

In the chemically-amplified resist, an acid-labile group in the resin dissociates by the action of an acid generated from the acid generator upon irradiation, thereby producing a carboxyl group. As a result, solubility of the irradiated part of the resist in an alkaline developer increases, whereby the irradiated part is dissolved in an alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as spin coating, cast coating, and roll coating to form a resist film. The resist film is then optionally pre-baked (hereinafter called "PB") and irradiated with radiation to form a predetermined resist pattern. As the radiation, ultraviolet rays, deep ultraviolet rays such as KrF excimer laser (wavelength: 248 nm), ArF excimer laser (wavelength: 193 nm), $F_2$ excimer laser (wavelength: 157 nm), and EUV (extreme ultraviolet rays, wavelength: 13 nm, etc.), charged particle rays such as electron beams, X-rays such as synchrotron radiation, or the like may be appropriately used. Of these, deep ultraviolet rays and electron beams are preferable. The irradiation conditions such as radiation dosage are appropriately determined depending on the composition of the radiation-sensitive resin composition, types of additives, and the like.

It is preferable in the present invention to perform post exposure bake (PEB) in order to stably form a highly-accurate minute pattern. The PEB ensures smooth dissociation of the acid-labile organic group in the acrylic polymer. The heating temperature for the PEB is usually 30-200° C., and preferably 50-170° C., although the heating conditions vary depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No. 6-12452, for example. Moreover, a protection film may be formed on the resist film as disclosed in Japanese Patent Application Laid-open No. 5-188598, for example, in order to prevent the effects of basic impurities and the like in an environmental atmosphere. These techniques may be employed in combination.

The irradiated resist film is then developed using an alkaline developer to form a predetermined resist pattern.

An alkaline aqueous solution in which tetramethylammonium hydroxide is dissolved, for example, is preferable as the developer used for development.

The concentration of the alkaline aqueous solution is usually 10 wt % or less. If the concentration of the alkaline aqueous solution exceeds 10 wt %, a non-irradiated area may also be dissolved in the developer.

An appropriate amount of surfactant or the like may be added to the alkaline aqueous solution. The resist film is generally washed with water and dried after development using the alkaline aqueous solution.

EXAMPLES

Example 1

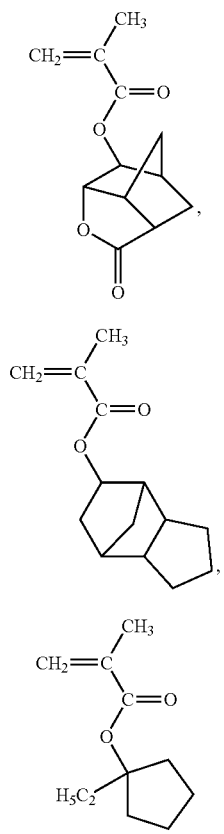

A monomer solution was prepared by dissolving 53.93 g (50 mol %) of compound (5-1), 10.69 g (10 mol %) of compound (5-2), and 35.38 g (40 mol %) of compound (5-3) in 200 g of 2-butanone, and further adding 5.58 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (72 g, yield: 72%). The polymer was a copolymer with an Mw of 7,400 and the mol % ratio of the recurring units of the compound (5-1), compound (5-2), and compound (5-3) determined by $^{13}$C NMR was 52.2:8.6:39.2 (mol %). This polymer is referred to as "acrylic polymer (A-1)".

Example 2

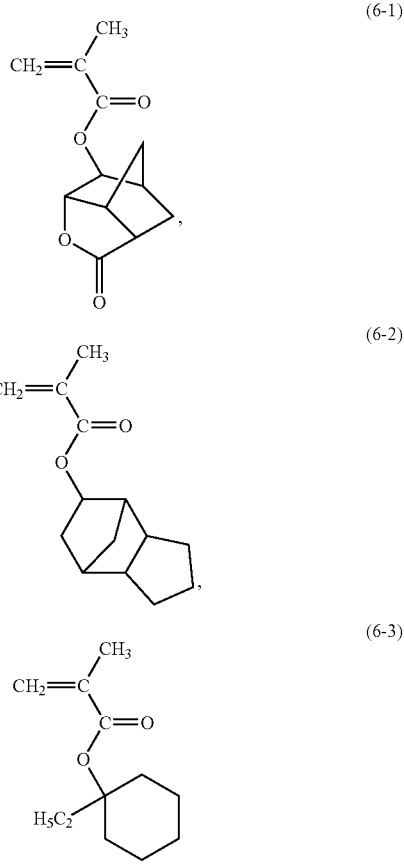

A monomer solution was prepared by dissolving 52.50 g (50 mol %) of compound (6-1), 10.41 g (10 mol %) of compound (6-2), and 37.09 g (40 mol %) of compound (6-3) in 200 g of 2-butanone, and further adding 5.44 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a polymer in the form of white resin powder (74 g, yield: 74%). The polymer was a copolymer with an Mw of 6,900 and the mol % ratio of the recurring units of the compound (6-1), compound (6-2), and compound (6-3) determined by $^{13}$C NMR was 53.0:9.8:37.2 (mol %). This polymer is referred to as "acrylic polymer (A-2)".

Example 3

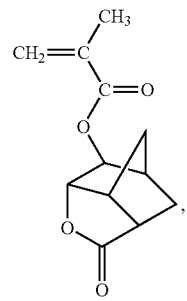
(7-1)

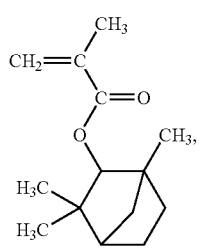
(7-2)

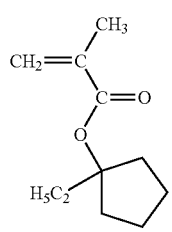
(7-3)

A monomer solution was prepared by dissolving 53.88 g (50 mol %) of compound (7-1), 10.78 g (10 mol %) of compound (7-2), and 35.34 g (40 mol %) of compound (7-3) in 200 g of 2-butanone, and further adding 5.58 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (72 g, yield: 72%). The polymer was a copolymer with an Mw of 7,100 and the mol % ratio of the recurring units of the compound (7-1), compound (7-2), and compound (7-3) determined by $^{13}$C NMR was 52.6:8.2:39.2 (mol %). This polymer is referred to as "acrylic polymer (A-3)".

Example 4

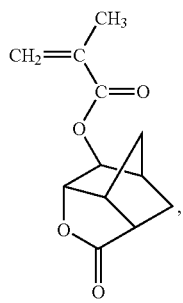
(8-1)

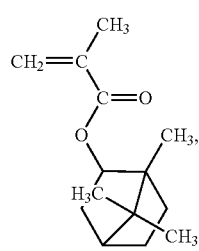
(8-2)

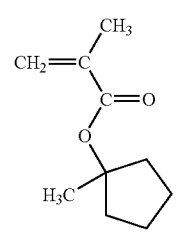
(8-3)

A monomer solution was prepared by dissolving 49.84 g (45 mol %) of compound (8-1), 16.62 g (15 mol %) of compound (8-2), and 33.45 g (40 mol %) of compound (8-3) in 200 g of 2-butanone, and further adding 5.73 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (68 g, yield: 68%). The polymer was a copolymer with an Mw of 6,200 and the mol % ratio of the recurring units of the compound (8-1), compound (8-2), and compound (8-3) determined by $^{13}$C NMR was 46.4:12.8:40.8 (mol %). This polymer is referred to as "acrylic polymer (A-4)".

Example 5

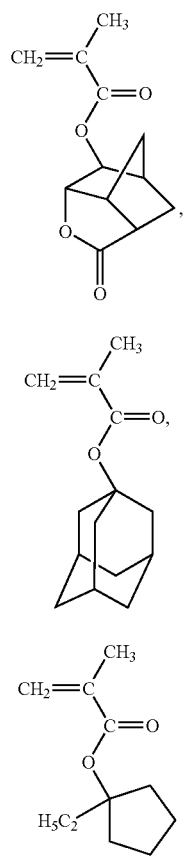

(9-1)

(9-2)

(9-3)

A monomer solution was prepared by dissolving 53.94 g (50 mol %) of compound (9-1), 10.69 g (10 mol %) of compound (9-2), and 35.37 g (40 mol %) of compound (9-3) in 200 g of 2-butanone, and further adding 4.74 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (73 g, yield: 73%). The polymer was a copolymer with an Mw of 7,200 and the mol % ratio of the recurring units of the compound (9-1), compound (9-2), and compound (9-3) determined by $^{13}$C NMR was 53.0:8.5:38.5 (mol %). This polymer is referred to as "acrylic polymer (A-5)".

Example 6

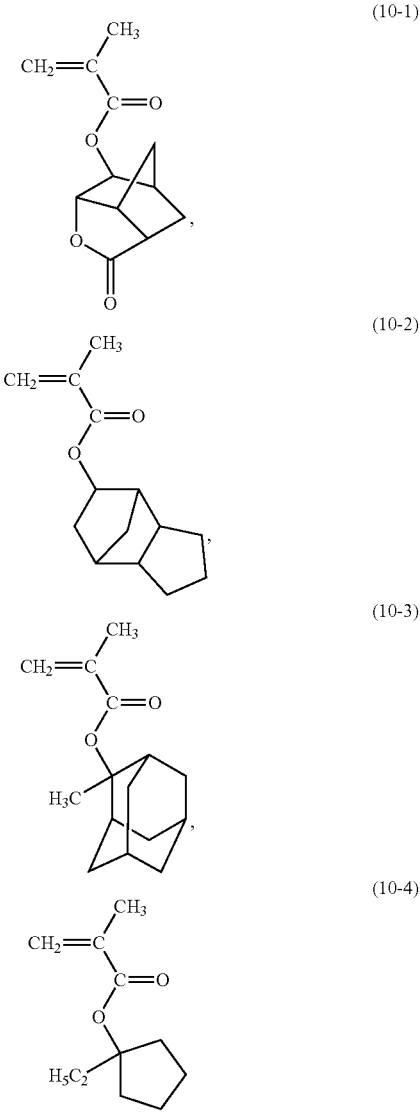

(10-1)

(10-2)

(10-3)

(10-4)

A monomer solution was prepared by dissolving 50.72 g (50 mol %) of compound (10-1), 10.06 g (10 mol %) of compound (10-2), 26.74 g (25 mol %) of compound (10-3), and 12.48 g (15 mol %) of compound (10-4) in 200 g of 2-butanone, and further adding 6.30 g of dimethyl 2,2'-azobis (2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (76 g, yield: 76%). The polymer was a copolymer with an Mw of 5,800 and the mol % ratio of the recurring units of the compound (10-1), compound (10-2), compound (10-3), and compound (10-4) determined by $^{13}$C NMR was 53.2:9.8:22.5:14.5 (mol %). This polymer is referred to as "acrylic polymer (A-6)".

Example 7

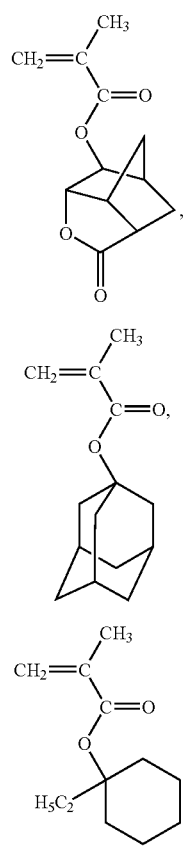

A monomer solution was prepared by dissolving 52.51 g (50 mol %) of compound (11-1), 10.41 g (10 mol %) of compound (11-2), and 37.09 g (40 mol %) of compound (11-3) in 200 g of 2-butanone, and further adding 5.58 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (80 g, yield: 80%). The polymer was a copolymer with an Mw of 8,500 and the mol % ratio of the recurring units of the compound (11-1), compound (11-2), and compound (11-3) determined by $^{13}$C NMR was 53.2:8.6:38.2 (mol %). This resin is referred to as "acrylic polymer (A-7)".

Example 8

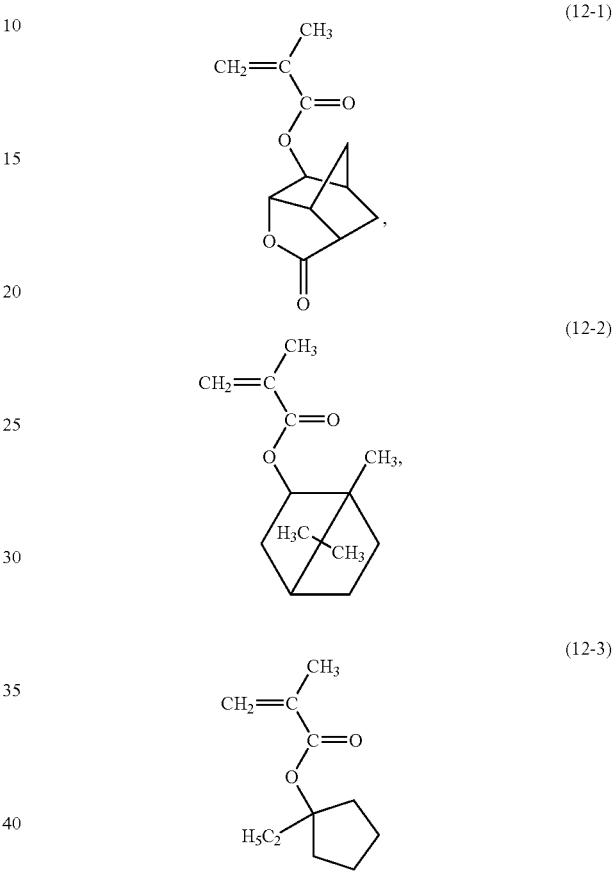

A monomer solution was prepared by dissolving 53.94 g (50 mol %) of compound (12-1), 10.69 g (10 mol %) of compound (12-2), and 35.37 g (40 mol %) of compound (12-3) in 200 g of 2-butanone, and further adding 5.62 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (77 g, yield: 77%). The polymer was a copolymer with an Mw of 8,400 and the mol % ratio of the recurring units of the compound (12-1), compound (12-2), and compound (12-3) determined by $^{13}$C NMR was 50.8:9.5:39.7 (mol %). This resin is referred to as "acrylic polymer (A-8)".

pound (13-2), and compound (13-3) determined by $^{13}$C NMR was 51.8:9.3:38.9 (mol %). This resin is referred to as "acrylic polymer (A-9)".

Example 9

Comparative Example 1

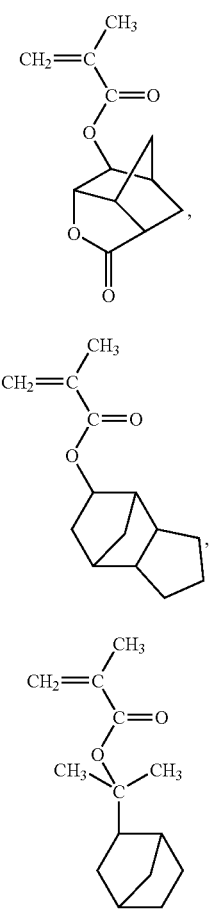

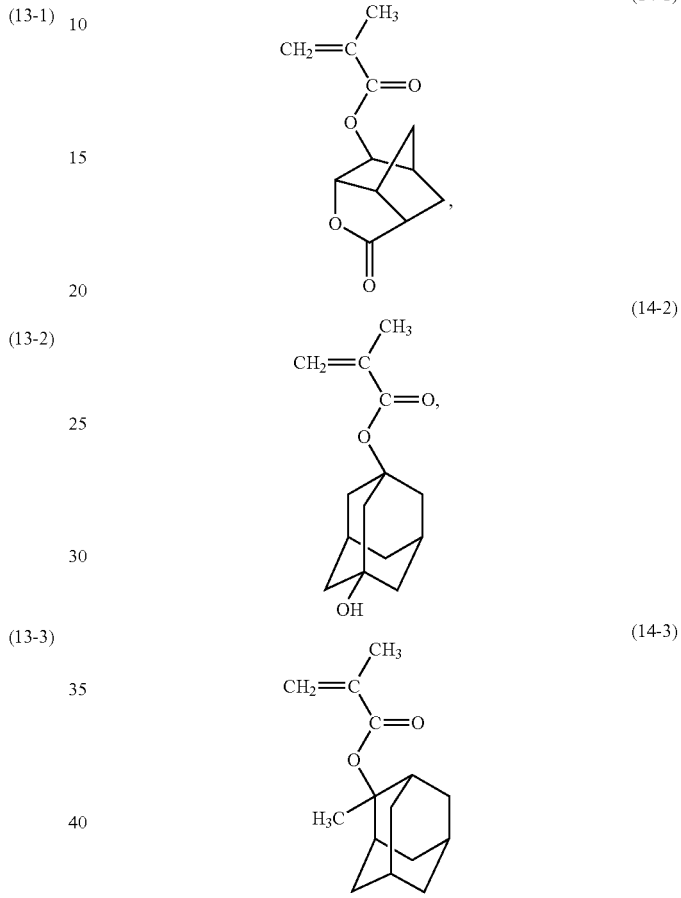

A monomer solution was prepared by dissolving 50.04 g (50 mol %) of compound (13-1), 9.92 g (10 mol %) of compound (13-2), and 40.04 g (40 mol %) of compound (13-3) in 200 g of 2-butanone, and further adding 5.18 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried at 50° C. for 17 hours to obtain a polymer in the form of white resin powder (75 g, yield: 75%). The polymer was a copolymer with an Mw of 7,700 and the mol % ratio of the recurring units of the compound (13-1), com- A monomer solution was prepared by dissolving 48.59 g (50 mol %) of compound (14-1), 20.67 g (20 mol %) of compound (14-2), and 30.74 g (30 mol %) of compound (14-3) in 200 g of 2-butanone, and further adding 4.03 g of dimethyl 2,2'-azobis(2-methylpropionate). A 1,000 ml three-necked flask was charged with 100 g of 2-butanone and nitrogen gas was purged into the flask for 30 minutes. After nitrogen purge, the flask was heated to 80° C. while stirring and the above monomer solution was added dropwise using a dropping funnel over three hours. The polymerization reaction was carried out for six hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a polymer in the form of white resin powder (74 g, yield: 74%). The polymer was a copolymer with an Mw of 9,800 and the mol % ratio of the recurring units of the compound (14-1), compound (14-2), and compound (14-3) determined by $^{13}$C NMR was 55.2:18.6:27.2 (mol %). This resin is referred to as "acrylic polymer (A-10)".

Examples 10 to 18 and Comparative Example 2

Radiation-sensitive resin composition solutions were prepared by mixing polymers obtained in Examples 1 to 9 and Comparative Example 1, acid generators described below, and other components in proportions shown in Table 1. The resulting radiation-sensitive resin composition solution was exposed to radiation under the conditions shown in Table 2 to evaluate various items. The evaluation results are shown in Table 3. In the examples, "part" refers to "part by weight" unless otherwise indicated.

Acid Generator (B)
  (B-1): Triphenylsulfonium nonafluoro-n-butanesulfonate

Acid Diffusion Controller (C)
  (C-1): Triethanolamine

Solvent (D)
  (D-1): Propylene glycol monomethyl ether acetate
  (D-2): Cyclohexanone Evaluation Method (1) Sensitivity When irradiating with light from an ArF light source, the composition solutions were applied to a silicon wafer with a 77 nm thickness ("ARC29," manufactured by Brewer Science Corp.) by spin coating and post-baked on a hot plate under the conditions shown in Table 3 to obtain a resist coating with a thickness of 250 nm. The coating was exposed to ArF excimer laser through a mask pattern using an ArF excimer laser exposure apparatus (manufactured by Nikon Corp., lens numerical aperture: 0.75, σ 0.75, ⅔ orbicular zone lightning). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose at which a line-and-space (1L1S) pattern with a line width of 120 nm was formed was taken as sensitivity.

(2) Resolution

The minimum line and space dimension resolved by an optimum dose of irradiation was taken as the resolution.

(3) Radiation Transmittance

The composition solution was applied to a quartz glass plate by spin coating and the coating was pre-baked on a hot plate at temperature and time conditions shown in Table 3 to obtain a resist film with a thickness of 300 nm. Radiation transmittance of the resist film was calculated from absorbance at a wavelength of 193 nm and was adopted as a standard for transparency in the deep UV ray region.

(4) Line Edge Roughness (LER)

In the observation of a 120 nm 1L/1S pattern developed with an optimum dose of exposure, the line width was inspected at arbitrary points from above the pattern using SEM (scanning electron microscope) S9220 manufactured by Hitachi, Ltd. and the fluctuation of the measurement was expressed by 3 Sigma. The sample was rated as "Bad" when the value was 10 nm or more, and "Good" when the value was less than 10 nm.

(5) PEB Temperature Dependency

In the observation of a 120 nm 1L/1S pattern developed with an optimum dose of exposure, the line width was inspected from above the pattern using SEM S9220 manufactured by Hitachi, Ltd. The differences between the line width when PEB was performed under the conditions shown in Table 2 and the line width at an optimum dose when the temperature of PEB was varied±2° C. was divided by the temperature difference, and the resulting change in the line width was regarded as the PEB temperature dependency (nm/° C.).

TABLE 1

|  | Polymer(A) (part) | Acid generator(B) (part) | Acid diffusion controller(C) (part) | Solvent(D) (part) |
|---|---|---|---|---|
| Example |  |  |  |  |
| 10 | A-1(100) | B-1(2) | C-1(0.30) | D-1(600) |
| 11 | A-2(100) | B-1(2) | C-1(0.30) | D-1(600) |
| 12 | A-3(100) | B-1(2) | C-1(0.30) | D-1(600) |
| 13 | A-4(100) | B-1(2) | C-1(0.30) | D-1(600) |
| 14 | A-5(100) | B-1(2) | C-1(0.30) | D-1(600) |
| 15 | A-6(100) | B-1(2) | C-1(0.30) | D-1(600) |
| 16 | A-7(100) | B-1(2) | C-1(0.30) | D-1(600) |
| 17 | A-8(100) | B-1(2) | C-1(0.30) | D-1(600) |
| 18 | A-9(100) | B-1(2) | C-1(0.30) | D-1(600) |
| Comparative Example |  |  |  |  |
| 2 | A-10(100) | B-1(2) | C-1(0.30) | D-1(450) D-2(150) |

TABLE 2

|  | Example | | | | | | | | | Comparative Example |
|---|---|---|---|---|---|---|---|---|---|---|
|  | 10 | 11 | 12 | 13 | 14 | 15 | 16 | 17 | 18 | 2 |
| Film thickness (nm) | 330 | 330 | 330 | 330 | 330 | 330 | 330 | 330 | 330 | 330 |
| Substrate | ARC29 | ARC29 | ARC29 | ARC29 | ARC29 | ARC29 | ARC29 | ARC29 | ARC29 | ARC29 |
| PB |  |  |  |  |  |  |  |  |  |  |
| Temperature (° C.) | 110 | 110 | 110 | 120 | 110 | 110 | 110 | 110 | 110 | 130 |
| Time (second) | 90 | 90 | 90 | 90 | 90 | 90 | 90 | 90 | 90 | 90 |
| PEB |  |  |  |  |  |  |  |  |  |  |
| Temperature (° C.) | 110 | 110 | 110 | 120 | 110 | 110 | 110 | 110 | 110 | 130 |
| Time (second) | 90 | 90 | 90 | 90 | 90 | 90 | 90 | 90 | 90 | 90 |

TABLE 3

| | Example | | | | | | | | | Comparative Example |
|---|---|---|---|---|---|---|---|---|---|---|
| | 10 | 11 | 12 | 13 | 14 | 15 | 16 | 17 | 18 | 2 |
| Transmittance (%) | 65 | 62 | 63 | 62 | 63 | 61 | 63 | 61 | 64 | 69 |
| Sensitivity (J/m$^2$) | 475 | 460 | 440 | 425 | 450 | 430 | 435 | 440 | 450 | 522 |
| Resolution (nm) | 90 | 90 | 90 | 90 | 90 | 90 | 90 | 90 | 90 | 100 |
| LER | Good | Good | Good | Good | Good | Good | Good | Good | Good | Bad |
| PEB-temp. dependency (nm/° C.) | 1.8 | 1.9 | 1.4 | 1.5 | 2.1 | 4.8 | 1.6 | 1.8 | 3.5 | 7.4 |

As shown in Table 3, radiation-sensitive resin compositions excelling in line edge roughness (LER) and PEB temperature independency were obtained in each of the above Examples.

INDUSTRIAL APPLICABILITY

Because the radiation-sensitive resin composition of the present invention excels in line edge roughness (LER) and PEB temperature independency, the composition is extremely useful as a chemically-amplified resist for manufacturing semiconductor devices, which will become more and more micronized.

The invention claimed is:

1. An acrylic polymer comprising a recurring unit (i) represented by the following formula (1), a recurring unit (ii) represented by the following formula (2), and an acid-labile group-containing recurring unit (iii) which contains at least one unit selected from a recurring unit represented by the following formula (3) and formula (4),

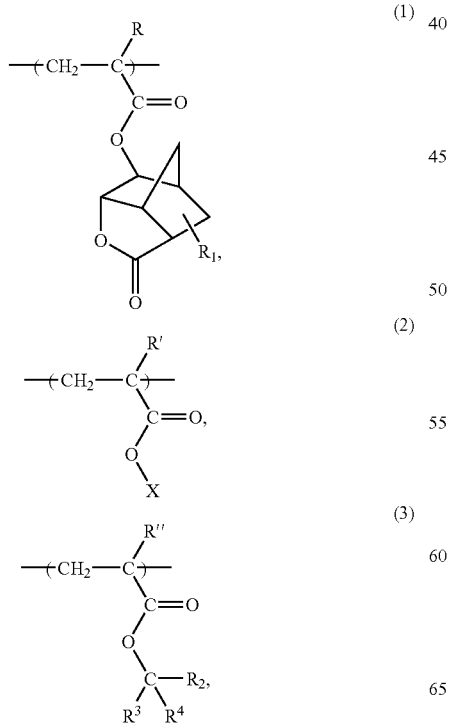

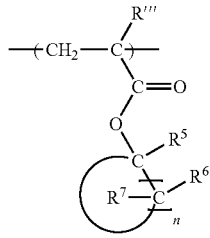

wherein, in the formulas (1) to (4), R, R', R", and R''' individually represent a hydrogen atom, methyl group, or trifluoromethyl group, in the formula (1), $R^1$ represents a hydrogen atom, linear or branched alkyl group having 1-4 carbon atoms, linear or branched alkoxyl group having 1-4 carbon atoms, or linear or branched fluoroalkyl group having 1-4 carbon atoms, in the formula (2), X represents a polyalicyclic hydrocarbon group consisting only of carbon and hydrogen which is one group selected from groups represented by the following formulas (2a) to (2l):

(2a)

(2b)

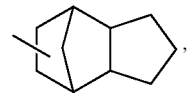
(2c)

(2d)

(2e)

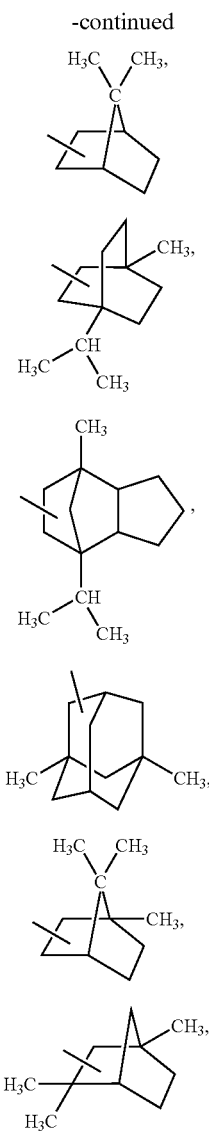

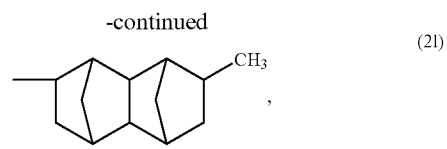

in the formula (3), R2 and R3 individually represent a linear or branched alkyl group having 1-4 carbon atoms and R4 represents an alicyclic hydrocarbon group having 4-20 carbon atoms, and in the formula (4), R5 represents a linear or branched alkyl group having 1-4 carbon atoms, R6 and R7 individually represent a hydrogen atom or a linear or branched alkyl group having 1-4 carbon atoms, and n represents an integer of 3-7.

2. The acrylic polymer according to claim 1, wherein the recurring unit (iii) is a group represented by the formula (4).

3. The acrylic polymer according to claim 2, wherein, in the formula (4), $R^5$ is a methyl group or ethyl group, $R^6$ and $R^7$ are hydrogen atoms, and n is 4 or 5.

4. The acrylic polymer according to claim 1, wherein, in the recurring unit (i) represented by the formula (1), R is a hydrogen atom or methyl group and $R^1$ is a hydrogen atom.

5. The acrylic polymer according to claim 1, wherein the proportion of the recurring units in the total recurring units is 20-70 mol % for the recurring unit (i), 1-20 mol % for the recurring unit (ii), and 20-60 mol % for the acid-labile group-containing recurring unit (iii).

6. A radiation-sensitive resin composition comprising the acrylic polymer according to claim 1 and a photoacid generator.

7. A radiation sensitive resin composition comprising the acrylic polymer according to claim 2 and a photoacid generator.

* * * * *